(12) United States Patent
Freitas et al.

(10) Patent No.: US 9,093,151 B2
(45) Date of Patent: Jul. 28, 2015

(54) PROGRAMMABLE REGULAR EXPRESSION AND CONTEXT FREE GRAMMAR MATCHER

(75) Inventors: Richard F. Freitas, San Martin, CA (US); Robert K. Montoye, Rochester, MN (US); Rajendra Shinde, Stanford, CA (US)

(73) Assignee: International Business Machines Corporation, Armonk, NY (US)

( * ) Notice: Subject to any disclaimer, the term of this patent is extended or adjusted under 35 U.S.C. 154(b) by 572 days.

(21) Appl. No.: 13/495,535

(22) Filed: Jun. 13, 2012

(65) Prior Publication Data

US 2013/0338998 A1    Dec. 19, 2013

(51) Int. Cl.
 G06F 17/27    (2006.01)
 G11C 15/04    (2006.01)
 G11C 13/00    (2006.01)

(52) U.S. Cl.
 CPC .......... G11C 15/046 (2013.01); G11C 13/0004 (2013.01)

(58) Field of Classification Search
 CPC ................................................ G06F 17/30477
 USPC .................................................. 704/9; 707/1
 See application file for complete search history.

(56) References Cited

U.S. PATENT DOCUMENTS

| | | | |
|---|---|---|---|
| 6,785,677 B1 * | 8/2004 | Fritchman | ............................ 1/1 |
| 7,225,188 B1 | 5/2007 | Gai et al. | |
| 7,656,716 B1 | 2/2010 | Srinivasan et al. | |
| 7,675,765 B2 * | 3/2010 | Derharcobian et al. | ... 365/49.17 |
| 2005/0273450 A1 * | 12/2005 | McMillen et al. | ................. 707/1 |
| 2008/0046423 A1 | 2/2008 | Khan Alicherry et al. | |
| 2010/0002481 A1 | 1/2010 | Lam et al. | |
| 2011/0030057 A1 * | 2/2011 | Chen et al. | ...................... 726/23 |

FOREIGN PATENT DOCUMENTS

KR    2007003488    1/2007

OTHER PUBLICATIONS

Meiners, Chad R., et al. "Fast regular expression matching using small TCAMs for network intrusion detection and prevention systems." Proceedings of the 19th USENIX conference on Security. USENIX Association, 2010.*

AbuHmed, Tamer, Abedelaziz Mohaisen, and DaeHun Nyang. "A survey on deep packet inspection for intrusion detection systems." arXiv preprint arXiv:0803.0037 (2008).*

(Continued)

*Primary Examiner* — Vincent P Harper
(74) *Attorney, Agent, or Firm* — Jeffrey T. Holman (57) ABSTRACT

A regular expression matcher system, including: a deterministic finite state machine (DFSM); a ternary content addressable memory (TCAM) matcher to compare a word stored at the TCAM matcher to an input stream, wherein the word determines a state-to-state transition of the DFSM from a comparison result; a programmable logic connected to an output of the TCAM matcher to identify a next state in the DFSM based on the comparison result; a state register to update a current state of the DFSM to the next state; and a collection data structure coupled to the TCAM matcher and the programmable logic to store a sequence of required state transitions for the DFSM, wherein the programmable logic determines a next required state transition to be matched from the sequence.

17 Claims, 6 Drawing Sheets

(56) References Cited

OTHER PUBLICATIONS

Yu et al. "Fast and Memory-Efficient Regular Expression Matching for Deep Packet Inspection" Proceedings of the 2006/ACM/IEEE Symposium on Architecture for Networking and Communications Systems, (Dec. 2006), pp. 93-102.

Yu et al. "Gigabit Rate Packet Pattern-Matching Using TCAM" Proceedings of the 12th IEEE International Conference on Network Protocols, (2004), pp. 174-183.

Piyachon et al. "Design of High Performance Pattern Matching Engine Through Compact Deterministic Finite Automata" Proceedings of the 45th Annual Design Automation Conference (2008), pp. 852-857.

Hayes "Implementation of Reduced Storage Finite Automata in Field-Programmable Gate Arrays" Masters Abstracts International, (2007), 1 page.

IBM "(705B) Phase-Change Based TCAM Architecture and Cell", IP.com, IPCOM000187746D, (Sep. 17, 2009), 3 pages.

* cited by examiner

PROGRAMMABLE REGULAR EXPRESSION AND CONTEXT FREE GRAMMAR MATCHER

BACKGROUND

Pattern matching applications are frequently characterized by the examination of a stream of symbols (typically characters) using one or more regular expressions. In such applications, a regular expression match causes the application to perform some operation. A representative example of such applications includes deep packet inspection. Deep packet inspection and other packet scanning can be important to network security.

In deep packet inspection, network traffic in-bound for a computer system is cleansed of computer viruses and other malware. Packet inspection can also be used to identify specific classes of applications and protocol definitions, among other things. By using regular expressions in deep packet inspection, rather than explicit string patterns, a packet scanner may be able to identify a large variety of patterns because of the flexibility and expressive power of regular expressions. However, conventional methods using regular expressions can also be much slower and more resource-intensive than explicit string patterns. Optimizing pattern matching systems for regular expressions may greatly improve speed and reduce memory consumption of regular expression searches.

SUMMARY

Embodiments of a system are described. In one embodiment, the system is an expression matching system. The system includes: an expression matcher; a ternary content addressable memory (TCAM) matcher to compare a word stored at the TCAM matcher to an input stream, wherein the word determines a state-to-state transition of the expression matcher from a comparison result; a programmable logic connected to an output of the TCAM matcher to identify a next state in the expression matcher based on the comparison result; a state register to update a current state of the expression matcher to the next state; and a collection data structure coupled to the TCAM matcher and the programmable logic to store a sequence of required state transitions for the DFSM, wherein the programmable logic determines a next required state transition to be matched from the sequence. Other embodiments of the system are also described.

Embodiments of a computer program product are also described. In one embodiment, the computer program product includes a computer readable storage device to store a computer readable program, wherein the computer readable program, when executed by a processor within a computer, causes the computer to perform operations for regular expression matching. The operations include: comparing data from an input stream to a word on a programmable ternary content addressable memory (TCAM) matcher to determine a state-to-state transition in an expression matcher from a comparison result; identifying a next state in the expression matcher based on the comparison result using a programmable logic connected to an output of the programmable TCAM matcher; updating the expression matcher to the next state; and storing a sequence of required state transitions for the expression matcher in a collection data structure coupled to the TCAM matcher and the programmable logic, wherein the programmable logic determines a next required state transition to be matched from the sequence. Other embodiments of the computer program product are also described.

Embodiments of a method are also described. In one embodiment, the method is a method for regular expression matching. The method includes: comparing data from an input stream to a word on a programmable ternary content addressable memory (TCAM) matcher to determine a state-to-state transition in an expression matcher from a comparison result; identifying a next state in the expression matcher based on the comparison result using a programmable logic connected to an output of the programmable TCAM matcher; updating the expression matcher to the next state; and storing a sequence of required state transitions for the expression matcher in a collection data structure coupled to the TCAM matcher and the programmable logic, wherein the programmable logic determines a next required state transition to be matched from the sequence. Other embodiments of the method are also described.

Other aspects and advantages of embodiments of the present invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments present a system and method for context-free expression matching. More specifically, the system provides one or more programmable ternary content addressable memory (TCAM) matchers to describe state-to-state transitions in an expression matcher that includes a deterministic finite state machine (DFSM)—also referred to as a deterministic finite automaton—and programmable logic coupled to the TCAM matchers to update a state register based upon an output of the TCAM matchers. In some embodiments, the system also includes a collection data structure (queue 214/stack/etc.) and counter to enable implementation of matchers that are able to count and save state information for later use within the system. In some embodiments, the system includes phase change memory (PCM) TCAM matchers and PCM based programmable logic.

By implementing the system using PCM technology, allowing the TCAM matchers and programmable logic to be programmable, and introducing the queue and counter into the system, the system may be faster, denser, and/or more effective than other software or hardware based solutions, particularly for systems using regular expression matching. Because regular expressions are more flexible and powerful than explicit string patterns, systems using regular expression matching may include different or more hardware to implement the regular expression matching to handle a data input stream than using only explicit string patterns. Additionally, the PCM based implementation provides a nonvolatile and radiation-hard hardware structure.

Figure 1:
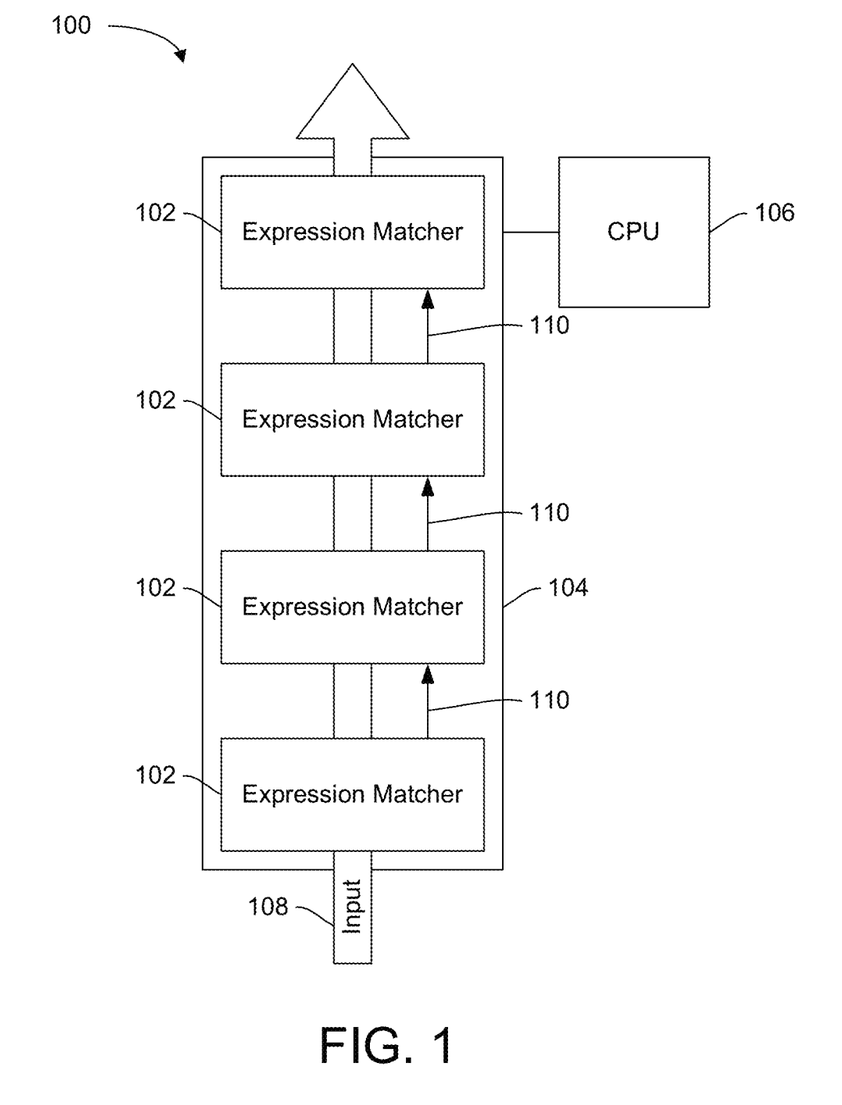
FIG. 1 depicts a schematic diagram of one embodiment of an expression matching system.

FIG. 1 depicts a schematic diagram of one embodiment of a regular expression matching system 100. In one embodiment, the expression matching system 100 includes a computer system 104 having multiple expression matchers 102 and a processor device 106, such as a CPU. The expression matching system 100 may include more than one computer system 104 with one or more CPUs and/or expression matchers 102. The CPU may communicate with all of the expression matchers 102 in the computer system 104 and perform operations for the expression matchers 102. In one embodiment, the expression matching system 100 is implemented on a network server between the input source and the input destination. The network server may use the system to filter viruses/malware, monitor/direct traffic, identify applications, and/or perform other upkeep/maintenance/security operations for the network on an input stream 108 into the computer system 104. The regular expression matching system 100 may also be used in speech recognition applications or for identifying patterns in streams of data for any application in which regular expression matching may be used.

The computer system 104 may be connected to a network of computers or may be in communication with other computing devices or systems through some other connection, such as an Internet connection. To interact with the other computing devices, the computer system 104 sends and receives information via the connection. Due to security, monitoring, load balancing, or other concerns, a network administrator may desire to implement packet content scanning in the computer system 104. Packet content scanning, such as deep packet inspection, includes comparing incoming data against a set of patterns or strings to check for computer viruses, specific classes of applications, protocol definitions, destinations/origination addresses, etc. The patterns may include, but are not limited to, string patterns, regular expressions and/or context-free grammar patterns. In one embodiment, the expression matching system includes a set of matchers 102 or aggregate of matchers 102 for matching elements in a pattern simultaneously.

In one embodiment, each expression matcher 102 is configured to identify a particular class of viruses. Consequently, the computer system 104 includes at least as many expression matchers 102 as virus classes that the computer system 104 is designed to identify and eliminate. In other embodiments, an expression matcher 102 may be configured to identify more than one virus class or a subset of a single virus class. The expression matchers 102 may be organized in series, such that the input stream 108 to the computer system 104 may pass through each expression matcher 102 in a predetermined sequence. In one embodiment, the expression matchers 102 may operate in parallel, such that the expression matchers 102 may perform matches simultaneously. The expression matchers 102 described herein may extend a class size of expression that may be matched without introducing errors, such as stack overflows.

When an expression matcher 102 identifies a particular data sequence in the input stream 108, the expression matcher 102 may then perform an operation for that sequence. For example, when an expression matcher 102 identifies a virus in the input stream 108, the expression matcher 102 may be configured to remove the virus from the input stream 108, and the input stream 108 passes to the next expression matcher 102. In another example, if the expression matcher 102 identifies a virus, the expression matching system 100 may terminate a connection with the input source. Each expression matcher 102 may be configured to perform a different operation, depending on the desired implementation. The expression matcher 102 may communicate with other expression matchers 102 within the computer system 104. The inter-matcher communication 110 may allow an expression matcher 102 upstream from another expression matcher 102 to implement certain changes or optimization to the state-to-state transitions of the downstream expression matcher 102.

In a network embodiment, when the input stream 108 has passed through the expression matching system 100 (including each of the expression matchers 102), the input stream 108 may be sent to the destination. In some embodiments, the destination may be part of the computer system 104 of which the expression matching system 100 is part. In other embodiments, the destination may be a separate computer system 104. In some embodiments, the input stream 108 may be received by another device within the computer system 104 before being sent to the expression matching system 100, or may be sent to another such device after passing through the expression matching system 100.

Figure 2:
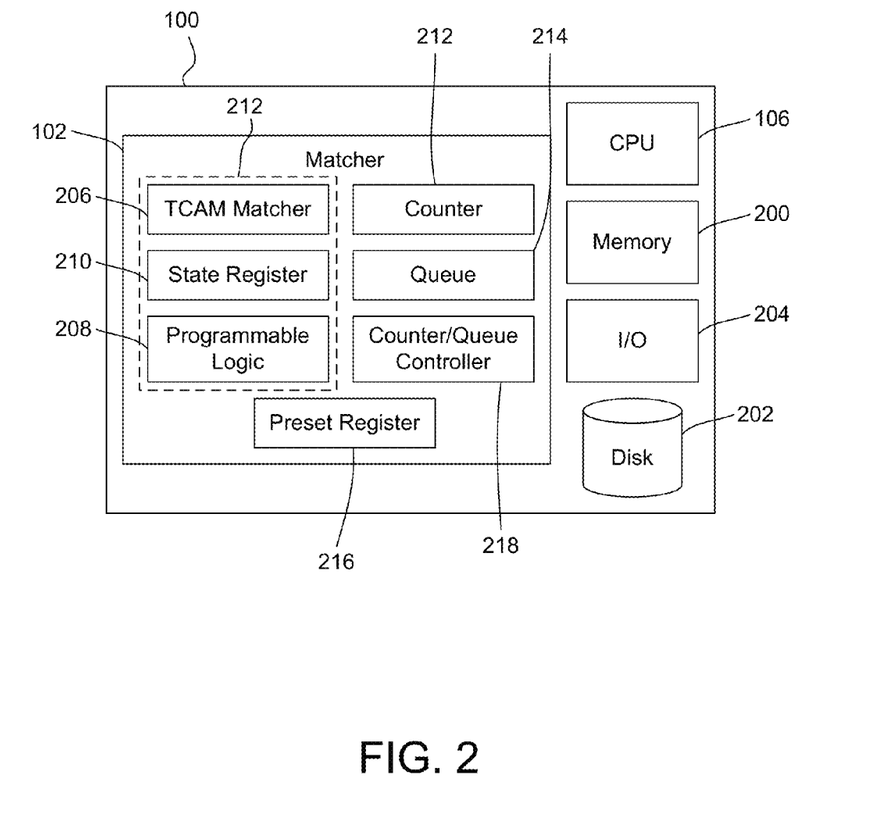
FIG. 2 depicts a schematic diagram of one embodiment of the expression matching system of FIG. 1.
Figure 6:
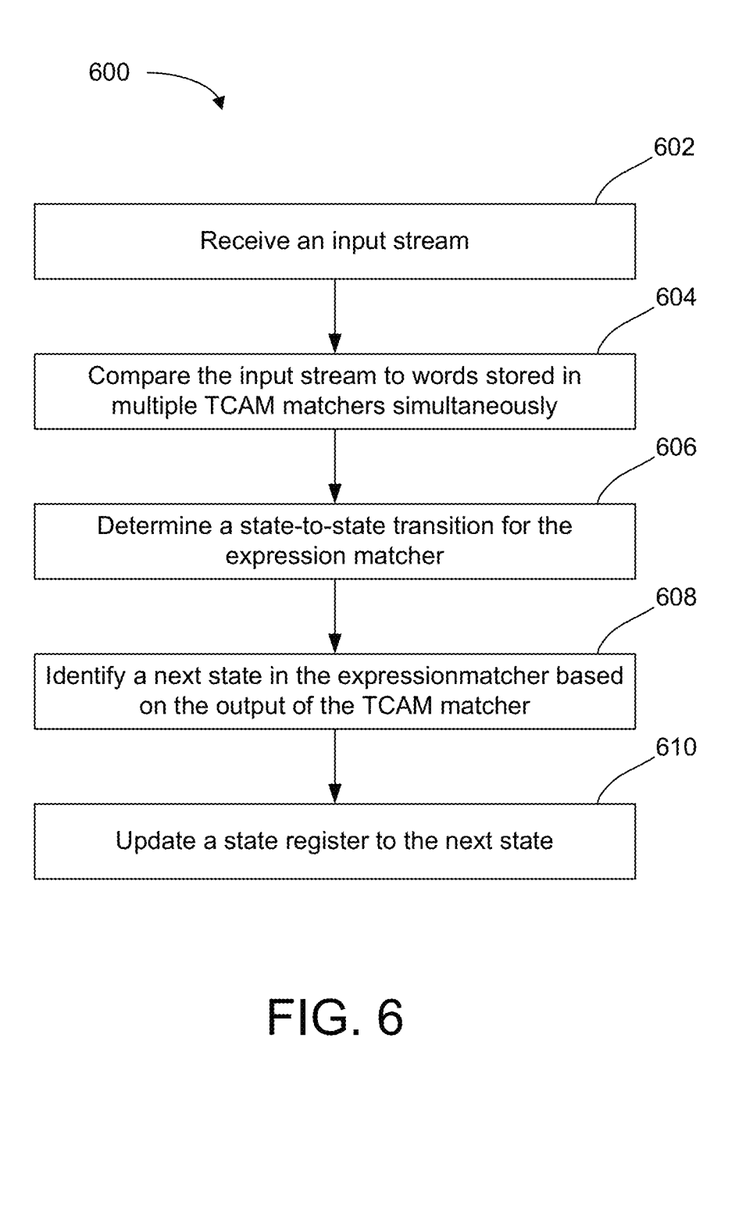
FIG. 6 depicts a flow chart diagram of one embodiment of a method for regular expression matching.

FIG. 2 depicts a schematic diagram of one embodiment of the regular expression matcher system 100 of FIG. 1. The depicted expression matching system 100 includes various components, described in more detail below, that are capable of performing the functions and operations described herein. In one embodiment, at least some of the components of the expression matching system 100 are implemented in a computer system 104. For example, the functionality of one or more components of the expression matching system 100 may be implemented by computer program instructions stored on a computer memory device 200 and executed by a processing device 106 such as a CPU. The expression matching system 100 may include other components, such as a disk storage drive 202, input/output devices 204, and an expression matcher 102. Some or all of the components of the expression matching system 100 may be stored on a single computing device or on a network of computing devices. The expression matching system 100 may include more or fewer components than those depicted herein. In some embodiments, the expression matching system 100 may be used to implement the methods described herein as depicted in FIG. 6.

The expression matcher 102 includes a DFSM 212 that includes a TCAM matcher 206 to store a pattern to match against the input stream 108. The TCAM matcher 206 may be a PCM TCAM matcher 206, such that the TCAM matcher 206 is programmable. A programmable TCAM matcher 206 allows the expression matching system 100 to modify the state-to-state transitions that determine the sequences of inputs that cause a match within the DFSM 212. The DFSM 212 may include multiple TCAM matchers 206, one for each of the words or sequences that the input stream 108 may match. The TCAM matchers 206 may perform matching operations on the input stream 108 in series or in parallel.

The DFSM 102 also includes programmable logic 208 for state control of the DFSM 102. The programmable logic 208 is coupled to an output of the TCAM matchers 206 and directs the updating of a state register 210 based on which TCAM matcher 206 is activated. A TCAM matcher 206 may be activated in response to finding a match in the input stream 108 to the word or sequence stored in the TCAM matcher 206. The programmable logic 208 may be PCM based. In one embodiment, the programmable logic 208 performs operations or actions based on a state saved in the state register 210, such that the operations or actions performed may be different depending on the current state. In one embodiment, the programmable logic 208 does not perform any actions based on a given state in the state register 210.

In some embodiments, the expression matcher 102 includes a counter 212 and a collection data structure (also referred to herein as a queue 214). The counter 212 and collection enable implementation of an expression matching system 100 that can count and save state information for later use. This may be useful in an expression matching system 100 that would otherwise require expression matchers 102 with an infinite or very high number of states. Some embodiments in which a counter 212 and collection may be useful include expression matching systems 100 that have complicated regular expressions, such as a regular expression having a fixed length restriction or requiring waiting for at least a set number of characters. In some embodiments, the collection may be a queue 214 data structure, including a first-in-first-out (FIFO) queue 214 or a last-in-first-out queue 214. In other embodiments, the collection is a stack data structure. While the embodiments herein describe the collection as a stack or queue 214 data structure, the collection may be any data structure suitable to the purposes of the expression matching system 100. In one embodiment, the expression matcher 102 includes a preset register 216 to input a preset number in the counter 212. The counter 212 may then count down from the preset value for each occurrence of a sequence or value stored in the queue 214. The expression matcher 102 may include a counter/queue controller 218 to interface between the programmable logic 208 and the counter 212/queue 214. The controller 218 may also interact with the TCAM matchers 206.

Figure 3:
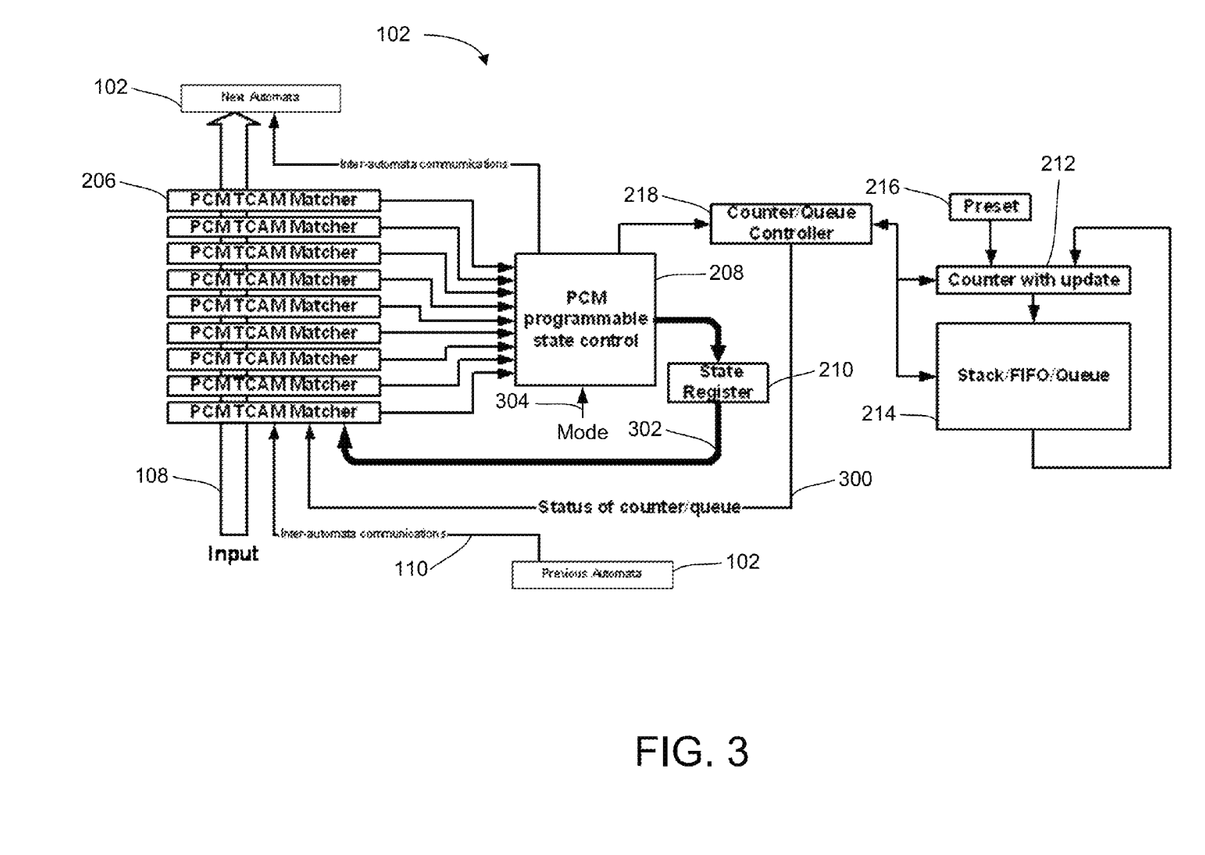
FIG. 3 depicts a schematic diagram of one embodiment of the expression matcher of FIG. 1.

FIG. 3 depicts a schematic diagram of one embodiment of the expression matcher 102 of FIG. 1. The expression matcher 102 may include several TCAM matchers 206. Each TCAM matcher 206 may correspond to a particular word or sequence of values to be matched to the input stream 108. The TCAM matchers 206 determine the state-to-state transitions within the expression matcher 102.

Each TCAM matcher 206 may include several different input fields. In one embodiment, the expression matcher 102 has four different input fields. The first input field corresponds to the data to match against the input stream 108—the word or sequence to be compared to the input stream 108. The second input field 110 corresponds to an inter-matcher communication 110 from a previous DFSM 102. This input may or may not include data, depending on the operation of the previous expression matcher 102. The third input field 300 corresponds to the status of the counter 212/queue 214 circuits. The controller 218 coupled to the counter 212 and queue 214 may control at least a portion of the operation of the counter 212/queue 214 components and may also transmit data to the TCAM matchers 206 that indicates a present operation status of the counter 212 and queue 214 with respect to an output of the programmable logic 208. The fourth input field 302 is the current state of the state machine from the state register 210. These four fields describe the conditions that indicate that a state change may be needed.

The output of each of the TCAM matchers 206 is sent to the programmable logic 208. The programmable logic 208 may be pre-programmed to associate the indication of a match to one of the TCAM matchers 206 with a group of set/reset terms for each of the bits in the state register 210 for the expression matcher 102 and for other outputs. The programmable logic 208 may have outputs that lead to the next expression matcher 102 within the computer system 104, to the state register 210, and to the controller 218. In some embodiments, each of the outputs contains at least some data that is different from the other outputs. In other embodiments, the outputs include the same data. The programmable logic 208 may include a mode input 304 to allow direct input into the programmable logic 208, such as a reset signal.

The state register 210 is updated according to the data sent from the programmable logic 208. In one embodiment, a TCAM matcher 206 finds a match in the input stream 108 and sends an indication of the match to the programmable logic 208. The programmable logic 208 then determines how the state register 210 is to be updated and sends a signal to the state register 210 containing the necessary data to update the state register 210. In some embodiments, the expression matcher state may change to another state due to an identified match. In other embodiments, the programmable logic 208 may indicate that there is no change in the expression matcher state in response to an identified match. Once the state register 210 has been updated successful according to the programmable logic 208, the state register 210 sends data to the TCAM matchers 206 that may indicate a current state, a previous state, or any other data which may be relevant to the determination of state-to-state transitions at the TCAM matchers 206.

The counter 212 and queue 214 may operate together or separately, depending on a current operation of the expression matcher 102. In one embodiment, the counter 212 and queue 214 are used to improve operation of the expression matcher 102 with regard to a given regular expression. Simple regular expressions may generally be matched using an expression matcher 102 without the counter 212 and queue 214. The counter 212 and queue 214 may be particularly useful with complicated regular expressions, such as those which require counting a set number of characters for a particular string or pattern match, or that require waiting for at least a set number of characters in the input stream 108 that match, particularly if the counts are high. By using a counter 212, only a few states may be required by the expression matcher 102 for accurate usage. Additionally, the queue 214 may be used to prevent overlapping or repeating patterns from being lost and causing errors in the expression matcher operation.

For example, if the search for a regular expression

*.a[n]b (a followed by n arbitrary characters and then a b)

then the string aa[n]b fails to match, even though the required string is actually present, because of the repeating a character. The queue 214 used as a stack resolves this problem. When the second a character is encountered, the value of the count is stacked. When the count runs out, if there is a stacked value, then the counter 212 is updated and the count continues. The second, correct string would then be matched. The preset register 216 may hold an initial count for the counter 212. The counter 212 may include an update feature that modifies the count in the counter 212 based on the value on the stack, when appropriate. This feature may help prevent the expression matcher 102 from creating infinite states to deal with a repeating string in the input stream 108 or in similar circumstances.

Figure 4:
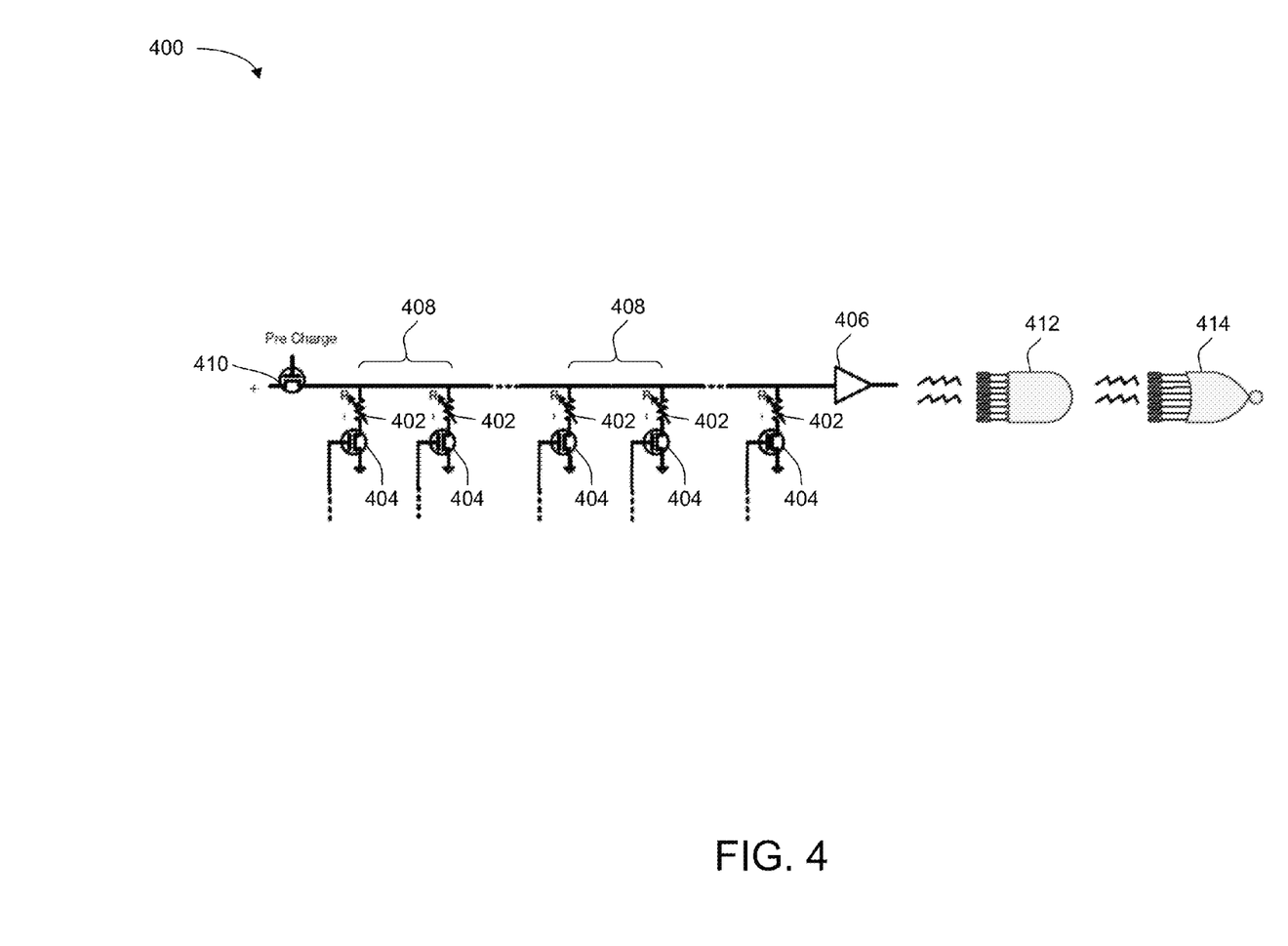
FIG. 4 depicts a schematic diagram of one embodiment of a phase change memory circuit.

FIG. 4 depicts a schematic diagram of one embodiment of a PCM circuit 400. The TCAM matchers 206 and the programmable logic 208 may share some equivalencies in some embodiments of the expression matching system 100, particularly because the TCAM matchers 206 and the programmable logic 208 are both programmable. In one embodiment, the TCAM matchers 206 and programmable logic 208 are implemented using PCM technology. The PCM circuit 400 may include a set of programmable resistors 402 and corresponding selection transistors 404. The resistors 402 may be tied to a sense circuit 406. By convention, two resistors 402 and their selection transistors 404 are referred to as a bit cell 408. The PCM circuit 400 may include one or more bit cells 408, depending on the programming requirements of the expression matcher 102. The resistors 402 may also be tied to a pre-charge circuit 410. The PCM circuit 400 shown is logically equivalent to a low true-input NAND gate 412 with a use/do not use switch (the resistor) on each input. The gate is also logically equivalent to a low true-output NOR gate 414. This equivalency may be exploited to make very large nonvolatile, programmable circuits, as shown in FIG. 5.

Figure 5:
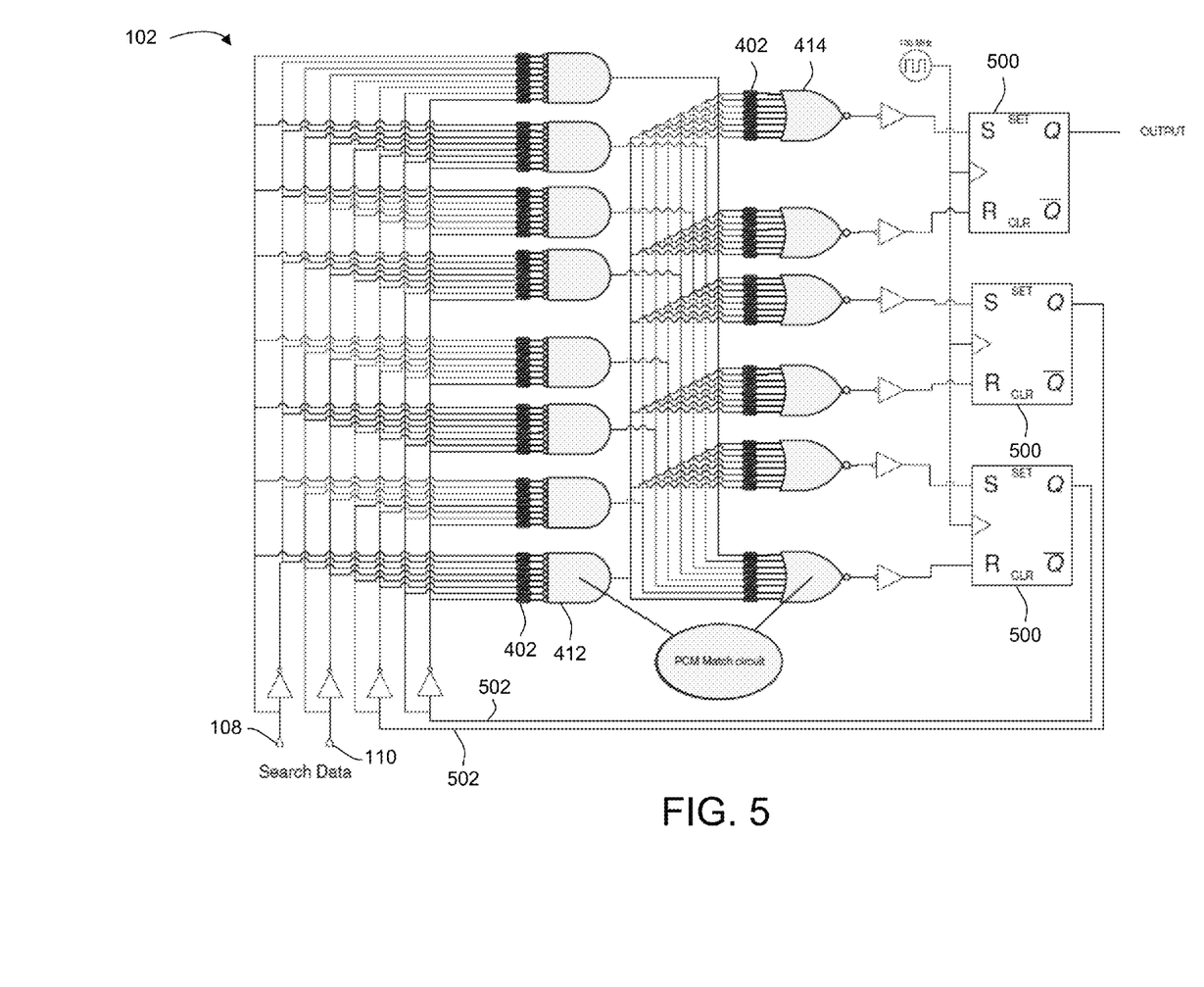
FIG. 5 depicts a schematic diagram of one embodiment of the expression matcher of FIG. 1.

FIG. 5 depicts a schematic diagram of one embodiment of the DFSM 102 of FIG. 1. In one embodiment, the expression matcher 102 includes TCAM matchers 206, programmable logic 208, and registers 500 that receive an output of the programmable logic 208. In some embodiments, the expression matcher 102 may include more or different components than those described herein. In some embodiments, the expression matcher 102 shown in FIG. 5 may be used to implement the methods and systems described herein, though the expression matcher 102 may be used to implement other methods and systems.

In one embodiment, each TCAM matcher 206 may be represented by a NAND gate 412 having programmable resistors 402 at each input into the NAND gate 414. The programmable resistors 402 into each input may be configured so that the NAND gate 414 gives an output only in response to inputs that match a certain combination determined by the resistors. In one embodiment, the NAND gates 414 receive inputs from an input stream 108, an inter-matcher communication 110 from a previous expression matcher 102, and outputs 502 of components within the expression matcher 102.

The outputs of the TCAM matchers 206 are coupled to the inputs to the programmable logic 208. In one embodiment, the programmable logic 208 includes NOR gates 414. Each input to the NOR gates 414 is coupled to an output of the NAND gates 412 of the TCAM matchers 206. The NOR gates 414 also include programmable resistors 402 at each input to allow the NOR gates 414 to be configured to activate and output certain values according to the states and state transitions in the expression matcher 102.

Because the inputs to each of the NAND gates 412 in the TCAM matchers 206 and the NOR gates 414 in the programmable logic 208 use PCM circuits 400, the gates 412, 414 are programmable and are also nonvolatile, such that the gates may maintain the programmed configurations without supplying additional power to the gates.

Each TCAM matcher 206 describes a state-to-state transition in the expression matcher 102, such that whenever a match is identified, a signal is generated to indicate a potential change to the state stored in the state register 210. The output of each TCAM matcher 206 connects to a resistor associated with a set and reset input for each state's bit. In one embodiment, a match indication only impacts the state of the state register 210 if the resistor to which the output line connects is in an on position (low resistance). In other embodiments, the resistors 402 and/or gates 412, 414 may be configured other than described herein.

The counter/queue controller 218, counter 212, queue 214, and/or the state register 210 may include one or more registers 500 that receive an output of the programmable logic 208. The expression matcher 102 may also include a register 500 to hold and output a value or sequence to the next expression matcher 102. The outputs of some of the registers 500—such as those for the state register 210 and the counter 212/queue 214—may be input back into the TCAM matchers 206, such that the TCAM matchers 206 may determine a next state-to-state transition based at least partially on the output of the counter 212/queue 214. Embodiments of the counter 212/queue 214/preset register 216 implementation within the expression matcher 102 may include more or fewer components than are shown and described herein.

FIG. 6 depicts a flow chart diagram of one embodiment of a method 600 for regular expression matching. Although the method 600 is described in conjunction with the expression matching system 100 of FIG. 1, embodiments of the method 600 may be implemented with other types of expression matching systems 100.

The expression matching system 100 receives 602 an input stream 108. The input stream 108 may originate from a computer system that is separate from the expression matching system 100, or the input stream 108 may originate from the computer system 104 containing the expression matching system 100. In one embodiment, the input stream 108 includes network data sent from a source computer system to a destination computer system over a network of computers. In some embodiments, the expression matching system 100 is a network server that filters/monitors any incoming, outgoing, or intra-network data through the network server. The expression matching system 100 may be implemented in computer systems 104 located in other than a network environment.

The expression matching system 100 compares 604 the received input stream 108 to a word or sequence stored in a TCAM matcher 206 in a DFSM 102. In one embodiment, the expression matching system 100 compares 604 the received input stream 108 to all words or sequences stored in the TCAM matchers 206 in a single expression matcher 102 simultaneously. In one embodiment, the expression matching system 100 compares 604 the received input stream 108 to all words or sequences stored in all TCAM matchers 206 for all expression matchers 102 simultaneously. Each expression matcher 102 may be configured to identify a class of applications, computer viruses, etc. Each expression matcher 102 may include any number of TCAM matchers 206, according to the specific use or configuration of the expression matcher 102. Each TCAM matcher 206 determines 606 to a state-to-state transition in the expression matcher 102. When one of the TCAM matchers 206 finds a match between a sequence of characters or other data in the input stream 108 to the word or sequence stored or pre-programmed at the TCAM matcher 206, the TCAM matcher 206 is activated and the state-to-state transition corresponding to the activated TCAM matcher 206 is determined. The TCAM matchers 206 may receive several inputs, including, but not limited to, the input stream 108 into the expression matching system 100, an input from a previous expression matcher 102, a counter 212/queue 214 status, and a state of the expression matcher 102 from the state register 210. The TCAM matchers 206 may be PCM TCAM matchers 206, in some embodiments.

When one of the TCAM matchers 206 is activated, the expression matching system 100 identifies 608 a next state in the expression matcher 102 based on the output of the TCAM matcher 206. This is done using the programmable logic 208 coupled to the output of the TCAM matcher 206. The programmable logic 208 receives the output of the TCAM matchers 206, and based on the combined output of the TCAM matchers 206, determines which state the expression matcher 102 should be in. The programmable logic 208 may be pre-programmed to associate an output from the TCAM matchers 206 indicating a match to the input with a group of set/reset terms for each of the bits in the state register 210 for the expression matcher 102 and also for any other outputs. The expression matching system 100 then updates 610 the state register 210 with the next state identified by the programmable logic 208. The programmable logic 208 may also be PCM based, and may be pre-programmed using programmable resistors and/or other components. In some embodiments, the TCAM matchers 206 or the programmable logic 208 may be programmed or re-programmed at any time.

In some embodiments, the expression matcher 102 may also send an output indicating any actions that the expression matcher 102 has performed to the next expression matcher 102 in the expression matching system 100. The data sent from one expression matcher 102 to another may be used either to program the expression matcher 102 or to aid the TCAM matchers 206 or programmable logic 208 to determine the state-to-state transitions and the next states.

The expression matching system 100 may also include a counter 212 and a collection data structure, such as a queue 214 or stack, to allow the expression matcher 102 to perform regular expression matching for complicated regular expressions. Some examples of regular expressions that may benefit from the counter 212 and queue 214 include regular expressions that require counting a set number of characters or that require waiting for at least a set number of characters to occur in the input stream 108. The counter 212 may maintain a count for a specified sequence of characters from the input stream 108. A preset register 216 may be coupled to the counter 212 to enter an initial count in the counter 212, and the counter 212 may count down from the initial count each time it receives an indication that the specified sequence has been matched by the TCAM matchers 206. The queue 214 may help determine a next required state transition for the expression matcher 102 to be counted by the counter 212. The programmable logic 208 may then determine the next required state transition to be matched from the sequence. Other embodiments of the expression matching system 100 may use more or fewer components than those described herein.

An embodiment of an expression matching system 100 includes at least one processor coupled directly or indirectly to memory elements through a system bus such as a data, address, and/or control bus. The memory elements can include local memory employed during actual execution of the program code, bulk storage, and cache memories which provide temporary storage of at least some program code in order to reduce the number of times code must be retrieved from bulk storage during execution.

It should also be noted that at least some of the operations for the methods may be implemented using software instructions stored on a computer useable storage medium for execution by a computer. As an example, an embodiment of a computer program product includes a computer useable storage medium to store a computer readable program that, when executed on a computer, causes the computer to perform operations, including an operation for regular expression matching. The system compares data from an input stream 108 to words stored on programmable TCAM matchers 206 simultaneously to determine a state-to-state transition in an expression matcher 102 from a comparison result. The system identifies a next state in the expression matcher 102 based on the comparison result using a programmable logic 208 connected to an output of the programmable TCAM matchers 206, and then updates the expression matcher 102 to the next state.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Embodiments of the invention can take the form of an entirely hardware embodiment, an entirely software embodiment, or an embodiment containing both hardware and software elements. In one embodiment, the invention is implemented in software, which includes but is not limited to firmware, resident software, microcode, etc.

Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The computer-useable or computer-readable medium can be an electronic, magnetic, optical, electromagnetic, infrared, or semiconductor system (or apparatus or device), or a propagation medium. A computer readable storage medium or device is a specific type of computer-readable or -usable medium. Examples of a computer-readable storage medium include a semiconductor or solid state memory, magnetic tape, a removable computer diskette, a random access memory (RAM), a read-only memory (ROM), a rigid magnetic disk, and an optical disk. Hardware implementations including computer readable storage media also may or may not include transitory media. Current examples of optical disks include a compact disk with read only memory (CD-ROM), a compact disk with read/write (CD-R/W), and a digital video disk (DVD).

Input/output or I/O devices (including but not limited to keyboards, displays, pointing devices, etc.) can be coupled to the system either directly or through intervening I/O controllers. Additionally, network adapters also may be coupled to the system to enable the data processing system to become coupled to other data processing systems or remote printers or storage devices through intervening private or public networks. Modems, cable modems, and Ethernet cards are just a few of the currently available types of network adapters.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A computer program product, comprising:
a computer readable storage device to store a computer readable program, wherein the computer readable program, when executed by a processor within a computer, causes the computer to perform operations for expression matching, the operations comprising:
comparing data from an input stream to a word on a programmable ternary content addressable memory (TCAM) matcher to determine a state-to-state transition in an expression matcher from a comparison result, wherein comparing the data further comprises:
receiving data from a previous expression matcher at the TCAM matcher; and
programming the TCAM matcher using the data from the previous expression matcher;
identifying a next state in the expression matcher based on the comparison result using a programmable logic connected to an output of the programmable TCAM matcher;
updating the expression matcher to the next state; and
storing a sequence of required state transitions for the expression matcher in a collection data structure coupled to the TCAM matcher and the programmable logic, wherein the programmable logic determines a next required state transition to be matched from the sequence.

2. The computer program product of claim 1, wherein the computer program product, when executed on the computer, causes the computer to perform additional operations, comprising:
comparing the data from the input stream to words on a plurality of TCAM matchers for a plurality of expression matchers simultaneously.

3. The computer program product of claim 1, wherein the TCAM matcher is a phase change memory (PCM) TCAM matcher.

4. The computer program product of claim 1, wherein the programmable logic is phase change memory (PCM) based, wherein a programmable resistor is placed at an input to a logic gate of the programmable logic to control operation of the logic gate.

5. The computer program product of claim 1, wherein the computer program product, when executed on the computer, causes the computer to perform additional operations, comprising:
maintaining a count for a specified data sequence from the input stream at a counter in the collection data structure.

6. The computer program product of claim 5, wherein the computer program product, when executed on the computer, causes the computer to perform additional operations, comprising:
setting an initial count for the counter using a preset register, wherein the counter counts down from the initial count in response to an occurrence of the specified data sequence.

7. A method for regular expression matching, comprising:
comparing data from an input stream to a word on a programmable ternary content addressable memory (TCAM) matcher to determine a state-to-state transition in an expression matcher from a comparison result, wherein comparing the data further comprises:
receiving data from a previous expression matcher at the TCAM matcher; and
programming the TCAM matcher using the data from the previous expression matcher;
identifying a next state in the expression matcher based on the comparison result using a programmable logic connected to an output of the programmable TCAM matcher;
updating the expression matcher to the next state; and
storing a sequence of required state transitions for the expression matcher in a collection data structure coupled to the TCAM matcher and the programmable logic, wherein the programmable logic determines a next required state transition to be matched from the sequence.

8. The method of claim 7, further comprising comparing the data from the input stream to words on a plurality of TCAM matchers for a plurality of expression matchers simultaneously.

9. The method of claim 7, wherein the TCAM matcher is a phase change memory (PCM) TCAM matcher.

10. The method of claim 7, wherein the programmable logic is phase change memory (PCM) based, wherein a programmable resistor is placed at an input to a logic gate of the programmable logic to control operation of the logic gate.

11. The method of claim 7, further comprising maintaining a count for a specified data sequence from the input stream at a counter in the collection data structure.

12. The method of claim 11, further comprising setting an initial count for the counter using a preset register, wherein the counter counts down from the initial count in response to an occurrence of the specified data sequence.

13. A regular expression (regex) matcher system, comprising:
an expression matcher;
a ternary content addressable memory (TCAM) matcher to receive data from a previous expression matcher at the TCAM matcher and use the data from the previous expression matcher, the TCAM matcher to compare a word stored on the TCAM matcher to an input stream, wherein the word determines a state-to-state transition of the expression matcher from a comparison result;

a programmable logic connected to an output of the TCAM matcher to identify a next state in the expression matcher based on the comparison result;

a state register to update a current state of the expression matcher to the next state; and a collection data structure coupled to the TCAM matcher and the programmable logic to store a sequence of required state transitions for the DFSM, wherein the programmable logic determines a next required state transition to be matched from the sequence.

14. The system of claim 13, further comprising a plurality of TCAM matchers to compare words stored on the TCAM matchers for a plurality of expression matchers simultaneously.

15. The system of claim 13, wherein the TCAM matcher is a phase change memory (PCM) TCAM matcher and the programmable logic is PCM based, wherein a programmable resistor is placed at an input to each logic gate of the TCAM matcher and the programmable logic to control operation of each logic gate.

16. The system of claim 13, further comprising a counter configured to maintain a count for a specified data sequence from the input stream.

17. The system of claim 16, further comprising a preset register to hold an initial count for the counter, wherein the counter counts down from the initial count in response to an occurrence of the specified data sequence.

* * * * *